(12) United States Patent
Long et al.

(10) Patent No.: US 10,250,134 B2
(45) Date of Patent: Apr. 2, 2019

(54) POWER MANAGER

(71) Applicant: Protonex Technology Corporation, Southborough, MA (US)

(72) Inventors: David N. Long, Northborough, MA (US); Seth M. Dziengeleski, Southbridge, MA (US); James D. Kazmierczak, Berlin, MA (US); Benjamin Apollonio, Lunenburg, MA (US); Michael J. Grennan, Hull, MA (US); My H. Lac, Westborough, MA (US)

(73) Assignee: Revision Military Ltd., Essex, VT (US)

( * ) Notice: Subject to any disclaimer, the term of this patent is extended or adjusted under 35 U.S.C. 154(b) by 73 days.

(21) Appl. No.: 14/231,865

(22) Filed: Apr. 1, 2014

(65) Prior Publication Data

US 2014/0292081 A1 Oct. 2, 2014

Related U.S. Application Data

(60) Provisional application No. 61/807,028, filed on Apr. 1, 2013.

(51) Int. Cl.
*H02M 3/156* (2006.01)
*H02J 1/10* (2006.01)
(Continued)

(52) U.S. Cl.
CPC ........ *H02M 3/156* (2013.01); *G01R 19/2513* (2013.01); *H02J 1/00* (2013.01);
(Continued)

(58) Field of Classification Search
USPC .......................................... 307/24
See application file for complete search history.

(56) References Cited

U.S. PATENT DOCUMENTS

| 4,044,268 A | 8/1977 | Hammel et al. |
| 4,589,075 A | 5/1986 | Buennagel |

(Continued)

FOREIGN PATENT DOCUMENTS

| EP | 2230743 | 11/2013 |
| WO | 2006/126023 | 11/2006 |

(Continued)

OTHER PUBLICATIONS

Examination Report for Australian Application No. 2014248342 dated Sep. 7, 2017.
(Continued)

*Primary Examiner* — Daniel Kessie
*Assistant Examiner* — Swarna N Chowdhuri
(74) *Attorney, Agent, or Firm* — Burns & Levinson LLP; George N. Chaclas

(57) ABSTRACT

An improved power manager includes a power bus (410) and multiple device ports (1-5), with at least one device port configured as a universal port (3 and 4) to be selectively connected to the power bus over an input power channel that includes an input power converter (510) or over a output or universal power channel (412, 416) that includes an output power converter (440, 442). The universal power channel (412) allows the input port (4) to be selected as an output power channel instead of an input power channel (i.e. operated as a universal port) for outputting power to device port (4) over power converter (440). The improved power manager (500) includes operating modes for altering an operating voltage of the power bus (505), to minimize overall power conversion losses due to DC to DC power conversions used to connect non-bus voltage compatible power devices to the power bus.

14 Claims, 5 Drawing Sheets

(51) Int. Cl.
  *G01R 19/25* (2006.01)
  *H02J 1/00* (2006.01)
(52) U.S. Cl.
  CPC ........... *H02J 1/102* (2013.01); *Y10T 307/352* (2015.04); *Y10T 307/391* (2015.04)

(56) References Cited

U.S. PATENT DOCUMENTS

| | | |
|---|---|---|
| 4,910,100 A | 3/1990 | Nakanishi et al. |
| 4,931,947 A | 6/1990 | Werth et al. |
| 5,153,496 A | 10/1992 | LaForge |
| 5,258,244 A | 11/1993 | Hall et al. |
| 5,321,349 A | 6/1994 | Chang |
| 5,570,002 A | 10/1996 | Castleman |
| 5,650,240 A | 7/1997 | Rogers |
| 5,675,754 A | 10/1997 | King et al. |
| 5,754,445 A | 5/1998 | Jouper et al. |
| 5,831,198 A | 11/1998 | Turley et al. |
| 5,898,291 A | 4/1999 | Hall |
| 5,903,764 A | 5/1999 | Shyr et al. |
| 5,914,585 A | 6/1999 | Grabon |
| 5,945,806 A | 8/1999 | Faulk |
| 5,977,656 A | 11/1999 | John |
| 5,986,437 A | 11/1999 | Lee |
| 6,014,013 A | 1/2000 | Suppanz et al. |
| 6,025,696 A | 2/2000 | Lenhart et al. |
| 6,046,514 A | 4/2000 | Rouillard et al. |
| 6,087,035 A | 7/2000 | Rogers et al. |
| 6,137,280 A | 10/2000 | Ackermann et al. |
| 6,198,642 B1 | 3/2001 | Kociecki |
| 6,221,522 B1 | 4/2001 | Zafred et al. |
| 6,246,215 B1 | 6/2001 | Popescu-Stanesti |
| 6,265,846 B1 | 7/2001 | Flechsig et al. |
| 6,271,646 B1 | 8/2001 | Evers et al. |
| 6,366,061 B1 | 4/2002 | Carley et al. |
| 6,366,333 B1 | 4/2002 | Yamamoto et al. |
| 6,370,050 B1 | 4/2002 | Peng et al. |
| 6,376,938 B1 | 4/2002 | Williams |
| 6,396,391 B1 | 5/2002 | Binder |
| 6,459,175 B1 | 10/2002 | Potega |
| 6,476,581 B2 | 11/2002 | Lew |
| 6,485,852 B1 | 11/2002 | Miller et al. |
| 6,492,050 B1 | 12/2002 | Sammes |
| 6,530,026 B1 | 3/2003 | Bard |
| 6,541,879 B1 | 4/2003 | Wright |
| 6,608,463 B1 | 8/2003 | Kelly et al. |
| 6,627,339 B2 | 9/2003 | Haltiner, Jr. |
| 6,628,011 B2 | 9/2003 | Droppo et al. |
| 6,633,823 B2 | 10/2003 | Bartone et al. |
| 6,690,585 B2 | 2/2004 | Betts-Lacroix |
| 6,694,270 B2 | 2/2004 | Hart |
| 6,703,722 B2 | 3/2004 | Christensen |
| 6,707,284 B2 | 3/2004 | Lanni |
| 6,828,695 B1 | 12/2004 | Hansen |
| 6,831,848 B2 | 12/2004 | Lanni |
| 6,925,361 B1 | 8/2005 | Sinnock |
| 6,985,799 B2 | 1/2006 | Zalesski et al. |
| 7,001,682 B2 | 2/2006 | Haltiner, Jr. |
| 7,002,265 B2 | 2/2006 | Potega |
| 7,036,028 B2 | 4/2006 | Zalesski |
| 7,071,660 B2 | 7/2006 | Xu et al. |
| 7,076,592 B1 | 7/2006 | Ykema |
| 7,105,946 B2 | 9/2006 | Akiyama et al. |
| 7,166,937 B2 | 1/2007 | Wilson et al. |
| 7,188,003 B2 | 3/2007 | Ransom et al. |
| 7,203,849 B2 | 4/2007 | Dove |
| 7,212,407 B2 | 5/2007 | Beihoff et al. |
| 7,226,681 B2 | 6/2007 | Florence et al. |
| 7,235,321 B2 | 6/2007 | Sarkar et al. |
| 7,243,243 B2 | 7/2007 | Gedeon |
| 7,256,516 B2 | 8/2007 | Buchanan et al. |
| 7,274,175 B2 | 9/2007 | Manolescu |
| 7,385,373 B2 | 6/2008 | Doruk et al. |
| 7,388,349 B2 | 6/2008 | Elder et al. |
| 7,408,794 B2 | 8/2008 | Su |
| 7,436,687 B2 | 10/2008 | Patel |
| 7,444,445 B2 | 10/2008 | Kubo et al. |
| 7,506,179 B2 | 3/2009 | Templeton |
| 7,531,915 B2 | 5/2009 | Wang et al. |
| 7,541,693 B2 | 6/2009 | Huang et al. |
| 7,618,260 B2 | 11/2009 | Daniel et al. |
| 7,646,107 B2 | 1/2010 | Smith |
| 7,674,543 B2 | 3/2010 | Chiang et al. |
| 7,675,758 B2 | 3/2010 | Artusi et al. |
| 7,683,575 B2 | 3/2010 | Berdichevsky et al. |
| 7,701,082 B2 | 4/2010 | Lazarovich et al. |
| 7,778,940 B2 | 8/2010 | Mazzarella |
| 7,808,122 B2 | 10/2010 | Menas et al. |
| 7,814,348 B2 | 10/2010 | Krajcovic et al. |
| 7,834,479 B2 | 11/2010 | Capp et al. |
| 7,838,142 B2 | 11/2010 | Scheucher |
| 7,844,370 B2 | 11/2010 | Pollack et al. |
| 7,847,532 B2 | 12/2010 | Potter et al. |
| 7,849,341 B2 | 12/2010 | Sugiyama |
| 7,855,528 B2 | 12/2010 | Lee |
| 7,928,720 B2 | 4/2011 | Wang |
| D640,192 S | 6/2011 | Robinson et al. |
| 8,073,554 B2 | 12/2011 | Vezza et al. |
| 8,086,281 B2 | 12/2011 | Rabu et al. |
| 8,103,892 B2 | 1/2012 | Krajcovic |
| 8,106,537 B2 | 1/2012 | Casey et al. |
| 8,138,631 B2 | 3/2012 | Allen et al. |
| 8,140,194 B2 | 3/2012 | Iino et al. |
| 8,164,217 B1 | 4/2012 | Miller |
| 8,178,999 B2 | 5/2012 | Burger et al. |
| 8,193,661 B2 | 6/2012 | Jagota et al. |
| 8,255,090 B2 | 8/2012 | Frader-Thompson et al. |
| 8,279,642 B2 | 10/2012 | Chapman et al. |
| 8,294,307 B2 | 10/2012 | Tsai |
| 8,304,122 B2 | 11/2012 | Poshusta et al. |
| 8,312,299 B2 | 11/2012 | Tremel et al. |
| 8,315,745 B2 | 11/2012 | Creed |
| 8,333,619 B2 | 12/2012 | Kondo et al. |
| 8,352,758 B2 | 1/2013 | Atkins et al. |
| 8,375,229 B2 | 2/2013 | Saeki |
| 8,401,709 B2 | 3/2013 | Cherian et al. |
| 8,447,435 B1 | 5/2013 | Miller et al. |
| 8,455,794 B2 | 6/2013 | Vogel |
| 8,466,662 B2 | 6/2013 | Nania et al. |
| 8,476,581 B2 | 7/2013 | Babayoff et al. |
| 8,494,479 B2 | 7/2013 | Budampati et al. |
| 8,508,166 B2 | 8/2013 | Marcinkiewicz et al. |
| 8,548,607 B1 | 10/2013 | Belz et al. |
| 8,599,588 B2 | 12/2013 | Adest et al. |
| 8,611,107 B2 | 12/2013 | Chapman et al. |
| 8,614,023 B2 | 12/2013 | Poshusta et al. |
| 8,633,619 B2 | 1/2014 | Robinson et al. |
| 8,638,011 B2 | 1/2014 | Robinson et al. |
| 8,643,326 B2 | 2/2014 | Campanella et al. |
| 8,648,492 B2 | 2/2014 | Craig et al. |
| 8,649,914 B2 | 2/2014 | Miller et al. |
| 8,682,496 B2 | 3/2014 | Schweitzer, III et al. |
| D706,711 S | 6/2014 | Robinson et al. |
| 8,775,846 B2 | 7/2014 | Robinson et al. |
| 8,781,640 B1 | 7/2014 | Miller |
| 8,796,888 B2 | 8/2014 | Rice et al. |
| 8,829,713 B2 | 9/2014 | Ishigaki et al. |
| 8,849,471 B2 | 9/2014 | Daniel et al. |
| 8,853,891 B2 | 10/2014 | Soar |
| 8,854,389 B2 | 10/2014 | Wong et al. |
| 8,890,474 B2 | 11/2014 | Kim et al. |
| 8,901,774 B2 | 12/2014 | Yan et al. |
| 8,913,406 B2 | 12/2014 | Guthrie et al. |
| 8,970,176 B2 | 3/2015 | Ballatine et al. |
| 9,041,349 B2 | 5/2015 | Bemmel et al. |
| 9,043,617 B2 | 5/2015 | Miki |
| 9,093,862 B2 | 7/2015 | Dennis et al. |
| 9,142,957 B2 | 9/2015 | Malmberg et al. |
| 9,158,294 B2 | 10/2015 | Carralero et al. |
| 9,190,673 B2 | 11/2015 | Venkataraman et al. |
| 9,203,302 B2 | 12/2015 | Kelly |
| 9,207,735 B2 | 12/2015 | Khaitan et al. |
| 9,337,943 B2 | 5/2016 | Mosebrook et al. |
| 9,343,758 B2 | 5/2016 | Poshusta et al. |

(56) References Cited

U.S. PATENT DOCUMENTS

| | | | |
|---|---|---|---|
| 9,450,274 | B2 | 9/2016 | Vo et al. |
| 9,452,475 | B2 | 9/2016 | Armstrong et al. |
| 9,502,894 | B2 | 11/2016 | Holmberg et al. |
| 9,634,491 | B2 | 4/2017 | Robinson et al. |
| 9,698,596 | B2 | 7/2017 | Sauer et al. |
| 9,722,435 | B2 | 8/2017 | Park |
| 2002/0135492 | A1 | 9/2002 | Reagan et al. |
| 2003/0006905 | A1 | 1/2003 | Shieh et al. |
| 2003/0054215 | A1 | 3/2003 | Doshi et al. |
| 2003/0085621 | A1* | 5/2003 | Potega ............... B60L 11/185 307/18 |
| 2003/0234729 | A1 | 12/2003 | Shen |
| 2004/0061380 | A1 | 4/2004 | Hann et al. |
| 2004/0125618 | A1 | 7/2004 | De Rooij et al. |
| 2005/0037241 | A1* | 2/2005 | Schneider ............ G06F 1/263 429/9 |
| 2005/0102043 | A1 | 5/2005 | Menas et al. |
| 2005/0275372 | A1 | 12/2005 | Crowell |
| 2006/0127725 | A9 | 6/2006 | Sarkar et al. |
| 2007/0007823 | A1 | 1/2007 | Huang et al. |
| 2007/0078230 | A1 | 4/2007 | Lai |
| 2007/0141424 | A1 | 6/2007 | Armstrong et al. |
| 2007/0184339 | A1 | 8/2007 | Scheucher |
| 2007/0222301 | A1 | 9/2007 | Fadell et al. |
| 2007/0257654 | A1* | 11/2007 | Krajcovic ............ H02J 1/14 323/297 |
| 2008/0024007 | A1 | 1/2008 | Budampati et al. |
| 2008/0130321 | A1 | 6/2008 | Artusi et al. |
| 2008/0269953 | A1 | 10/2008 | Steels et al. |
| 2008/0305839 | A1 | 12/2008 | Karaoguz et al. |
| 2009/0079263 | A1 | 3/2009 | Crumm et al. |
| 2009/0243390 | A1* | 10/2009 | Oto ..................... H02J 7/34 307/43 |
| 2010/0001689 | A1 | 1/2010 | Hultman et al. |
| 2010/0076615 | A1 | 3/2010 | Daniel et al. |
| 2010/0134077 | A1 | 6/2010 | Krajcovic |
| 2010/0280676 | A1 | 11/2010 | Pabon et al. |
| 2011/0026282 | A1 | 2/2011 | Chapman et al. |
| 2011/0031958 | A1 | 2/2011 | Wang |
| 2011/0184585 | A1 | 7/2011 | Matsuda et al. |
| 2011/0198933 | A1 | 8/2011 | Ishigaki et al. |
| 2011/0234000 | A1 | 9/2011 | Yan et al. |
| 2011/0261601 | A1 | 10/2011 | Chapman et al. |
| 2011/0278957 | A1 | 11/2011 | Eckhoff et al. |
| 2012/0092903 | A1 | 4/2012 | Nania et al. |
| 2012/0098334 | A1 | 4/2012 | Holmberg et al. |
| 2012/0205976 | A1 | 8/2012 | Shih et al. |
| 2012/0319504 | A1 | 12/2012 | Malmberg et al. |
| 2012/0326516 | A1* | 12/2012 | Gurunathan ........... H02J 1/00 307/72 |
| 2013/0038306 | A1 | 2/2013 | Kelly et al. |
| 2013/0163302 | A1* | 6/2013 | Li ........................ H02M 3/158 363/127 |
| 2013/0293013 | A1* | 11/2013 | Templeton ............ H02J 1/10 307/64 |
| 2014/0091623 | A1 | 4/2014 | Shippy et al. |
| 2014/0292081 | A1 | 10/2014 | Long et al. |

FOREIGN PATENT DOCUMENTS

| | | |
|---|---|---|
| WO | 2007/012785 | 2/2007 |
| WO | 2007/048837 | 5/2007 |
| WO | 2007/076440 | 7/2007 |
| WO | 2008/072014 | 6/2008 |
| WO | 2008/072015 | 6/2008 |
| WO | 2008072014 | 6/2008 |
| WO | 2008/090378 | 7/2008 |
| WO | 2011/023678 | 3/2011 |
| WO | 2011/046645 | 4/2011 |
| WO | 2011113280 | 9/2011 |
| WO | 2012/122315 | 9/2012 |
| WO | 2012/122315 A1 | 9/2012 |
| WO | 2013/083296 | 6/2013 |
| WO | 2014/165469 | 10/2014 |

OTHER PUBLICATIONS

International Search Report dated Sep. 8, 2014 in corresponding PCT application PCT/US14/32455.
Karlsson et al, DC Bus Voltage Control for a Distributed Power System, IEEE Transactions on Power Electronics, Nov. 2003, pp. 1405-1412, v: 18, n: 6.
Australian Patent Examination Report No. 1 for Australian Patent Application No. 2010307261 dated Jul. 23, 2013.
ISR for International Application No. PCT/JP2008/066605 dated Dec. 16, 2008.
International Search Report, International Application No. PCT/US2010/41335 (dated Mar. 24, 2011).
Written Opinion of the International Searching Authority, International Application PCT/US2010/41335 (dated Mar. 24, 2011).
U.S. Final Office Action in U.S. Appl. No. 12/733,585 (dated Jun. 18, 2013).
U.S. Non-Final Office Action in U.S. Appl. No. 12/733,585 (dated Jan. 17, 2013).
U.S. Final Office Action in U.S. Appl. No. 12/816,080 (dated Apr. 30, 2013).
U.S. Non-Final Office Action in U.S. Appl. No. 12/816,080 (dated Oct. 4, 2012).
U.S. Non-Final Office Action in U.S. Appl. No. 13/620,086 (dated Jan. 14, 2013).
Cipriano et al., Joint Service Power Expo, 2009
SFC, Power Manager—The SFC Power Manager—The technology http://web.archive.org/web/20090312005238/http:/www.sfc.com/en/man-portable-technology-power-manager.html.
Reuters, Protonex to Launch Soldier-Worn Portable Power Management Systems, Feb. 2009 http://www.reuters.com/article/idUS159777+17-Feb-2009+BW20090217#cp8McGk2XDy11b8d.97.
Cell, SFC Smart Fuel Cell launches Joint Power Manager, Jun. 2009 https://fuelcellsworks.com/archives/2009/06/04/sfc-smart-fuel-cell-launches-joint-power-manager/.
Corporation, Soldier-worn portable power management system, Apr. 2009 http://www.energyharvestingjournal.com/articles/1375/soldier-worn-portable-power-management-system.
Alibaba.com, 5KW charger controller for wind power supply and solar cell, 2009, 3 pages.
Amazon.com: Morningstar TriStar-45 Solar Charge Controller for solar/wind generator/Wind Turbine-45 amps, 2009, 6 pages.
Bruce et al.,www.rfdesign.com, Defense Electronics, Military takes aim at high battery costs, Apr. 2005, pp. 20-25.
F.H. Khan et al., ww.ietdl.org, IET Power Electronics, Bi-directional power manager management and fault tolerant feature in a -5kW multivlevel dc-dc converter with modular architecture, 2009, pp. 595-604, vol. 2, No. 5, 10 pages.
Fran Hoffart, New charger topology maximizes battery charging speed, 1998, 2 pages.
Green Plug, www.greenplug.us, One plug one planet, 2009, 7 pages. greentmcnet.com/topics/green/articles/57729-green-plug-partners-with-wipower-advanced-wireless-power.htm, Gren plug partners with wipower for advanced wireless power systems, 2009, 3 pages.
Greg Cipriano et al., Protonex, Joint Service Power Expo, 2009, 38 pages.
http://defense-update.com/products/b/ba5590.htm, BA 5590 Lithium Battery, Jul. 26, 2006, 1 page.
http://fuelcellsworks.com/news/2009/06/04/sfc-smart-fuel-cell-launches-joint-power-manager, SFC smart fuel cell launches joint power manager, Jun. 2009, 4 pages.
Ian C. Evans et al., IEEE electric ship technologies symposium, High power clean dc bus generation using ac-link ac to dc power voltage conversion, dc regulation, and galvanic isolation, 2009, 12 pages.
Inki Hong et al., IEEE Transactions on computer-aided design of integrated circuits and systems, Power Optimization of variable-voltage core-based systems, Dec. 1999, vol. 18, No. 12, 13 pages.
Jaber A. Abu et al., Twenty-Fourth Annual IEEE Applied Power Electronics Conference and Exposition, Control Scheme for high-efficiency high-performance two-stage power converters, 2009, 7 pages.

(56) References Cited

OTHER PUBLICATIONS

Jorge L. Duarte et al., IEEE Transactions on Power Electronics, Three-Port Bidirectional converter for hybrid fuel cell systems, 2007, vol. 22, No. 2, 8 pages.

Julio Garcia, 2009 Barcelona Forum on Ph.D. Reseach in Electronic Engineering, Efficiency improvements in autonomous electric vehicles using dynamic commutation of energy resources, 2009, 2 pages.

Karlsson et al., IEEE Transactions on power electronics, DC bus voltage control for a distributed power system, Nov. 2003, pp. 1405-1412, v: 18, n:6, 8 pages.

Leonid Fursin et al., Development of compact variable-voltage, bi-directional 100kw dc-dc converter, 2007, 9 pages.

M. Becherif et al., Vehicle power and propulsion conference (VPPC), 2010 IEEE, IEEE Power and Propulsion Conference (VPPC), Advantages of variable DC bus voltage for hybrid electrical vehicle, 201, pp. 1-6.

M. Conti et al., SystemC modeling of a dynamic power management architecture, 6 pages.

Mat Dirjish, http://electronicdesign.com/Articles/Index.cfm?AD=1&ArticlesID-19515; Enginner seeks cure for common wall warts, Aug. 2008, 3 pages.

Matthew Alan Merkle, Thesis submitted to the faculty of Virginia Polytechnic Institute and State UniversityVariable bus voltage modeling for series hybrid electric vehicle simulation, Dec. 1997, 33 pages.

Ocean Server Technology, Inc., Intelligent Battery and Power System, May 2008, 4 pages.

Ocean Server Technology, Inc., Smart Li-ion packs, integrated chargers, ultra high efficiency dc-dc converters, integrate battery power or backup, fully engineered (plug and run) and 95 to 25,000+ watt-hour clusters, 2007, 4 pages.

Peter Podesser, www.mil-embedded.com/articles/id/?3966, Portable power management for soldiers; Fuel cell hybrid system is lighter, safer, May 2009.

replay.waybackmachine.org/20090122152343/http://ww.sfc.com/en/about-sfc.html, About SFC Smarl Fuel Cell, 1 page.

replay.waybackmachine.org/20090312005238/http://ww.sfc.com/en/man-portable-technology-power-manager.html, The SFC Power Manager—The Technology, 2009, 2 pages.

Reyneri et al., IAC-09.C3.2.8, A redundant power bus for distributed power management for a modular satellite, 2009, 8 pages.

Richter Wolfgang, Chip for saving power, Aug. 2007, 2 pages.

Robert M. Button, Nasa/TM-2002-211370, Intelligent Systems for Power Management and Distribution, Feb. 2002, 12 pages.

Singh et al., Conference Record of the Twenty-Eighth IEEE Photovoltaic Specialists Conference, Fuzzy Logic-based Solar Charge Controller for Microbatteries, 2000, pp. 172-1729.

Wilson Rothman, gizmodo.com/295076/new-Honeywell-hdmi-cable-heals-self-but-at-what-cost, New Honeywell HDMI Cables Heals Self, but at What Cost?, Aug. 2007, 3 pages.

ww.sfc.com/index2.php option=com_pressreleasees&Itemid=467&id=1050&lang=en&pop-1&page=0, SFC receives commercial order for portable fuel cells, 2008 1 page.

www.energyharvestingjournal.com/articles/soldier-worn-portable-power-management-system-00001375.asp?sessionid=1, Energy Harvesting Journal: Soldier-worn portable power management system, 2009, 2 pages.

www.mpoweruk.com/bms.htm,Battery Management Systems (BMS), 2009, 12 pages.

www.nkusa.com/prod-monitor-smart-cable.htm, Nihon Kohden: Products-Monitoring, Smart Cable Technology, 1 page.

www.paneltronics.com/ip.asp?op=Multiplex%20Distribution%20Systems, Paneltronics, What is Power Sign?, 2006, 2 pages.

www.reuters.com/article/pressRelease/idUS159777+17-Feb-2009+BW20090217, Reuters, Protonex to Launch Soldier-Worn Portable Power Management Systems, Feb. 2009, 3 pages.

www.sfc.com, About SFC Smart Fuel Cell, 2009, 1 page.

International Search Report and Written Opinion for International Application No. PCT/US2014/032455, dated Sep. 8, 2014, 12 pages.

Australian Examination Report No. 1 for Application No. 2014248342 dated Sep. 7, 2017, 3 pages.

European Search Report for European Patent Application No. 14780196.3 dated Dec. 9, 2016, 5 pages.

Singapore Examination Report for Singapore Patent Application No. 11201508091P dated Feb. 28, 2017, 11 pages.

\* cited by examiner

POWER MANAGER

1 CROSS-REFERENCE TO RELATED APPLICATION

This application claims priority to U.S. Provisional Patent Application No. 61/807,028, filed Apr. 1, 2013, which is incorporated herein by reference.

2 BACKGROUND OF THE INVENTION

2.1. Field of the Invention

The exemplary, illustrative, technology herein relates to power manager systems suitable for operably connecting one or more power sources and one or more power loads to a power bus and distributing power from the power sources to the power loads over the power bus. The improved power manager includes at least one universal port that can be operated as an input port to receive input power from a power source and that can also be operated as an output port to deliver output power to a power load. Additionally the improved power manager includes system and operating method improvements provided to reduce power loss stemming from DC to DC power conversions.

2.2. The Related Art

Referring to FIGS. 1 and 2, a conventional power manager (100, 200) includes a Direct Current (DC) power bus (105) and six power ports (110, 130) operably connectable with the power bus. Up to six external power devices (115, 120) can be connected, one to each of the six device ports (110), and all six external power devices can be operably connected to the power bus (105) simultaneously. In one particularly relevant embodiment disclosed in U.S. Pat. No. 8,633,619 to Robinson et al. entitled Power managers and method for operating power managers, issued on Jan. 21, 2014; a power manager is disclosed that includes six device ports. The power manager system disclosed by Robinson et al. is shown schematically in FIGS. 1 and 2. In FIG. 1, a power manager (100) includes six device ports with two input device ports (130) and four output device ports (110). When all the device ports are connected to external power devices each device port (110, 130) is connected to an input power or energy source (115) or to a power load (120).

Each device port is operably connectable to a power bus (105) by operating one or more controllable switches. In an initial state each controllable switch is open (shorted) to disconnect the device port from the power bus. An electronic controller (125, 205) operates the controllable switches according to an energy management schema program or firmware running on the electronic controller. The electronic controller also communicates with each external device (115, 210) or with a smart cable associated with the external device to determine its operating voltage range and other power characteristics. The electronic controller continuously monitors external devices connected to the device ports and continuously evaluates if each connected external power device is a power source or a power load and further determines whether the external power device can be connected to the power bus (105) or not. In the event that the electronic controller determines that the connected external device is not compatible with connecting to the power bus the device is not connected. In the event that the electronic controller determines that an external device already connected to the power bus is no longer compatible with connecting to the power bus the device is disconnected by actuating a controllable switch.

The power manager (100, 200) is configured as a Direct Current (DC) device suitable for use with DC power sources and DC power loads. The conventional power bus (105) operates at a substantially fixed DC voltage. While the fixed bus DC voltage may fluctuate as power loads and power sources are connected to or disconnected from the power bus (105) the power bus voltage is substantially maintained within a small voltage range, e.g. 10-14 volts or the like, referred to herein as a "bus-compatible voltage."

When an external power device (115, 120) is determined to be operable at a bus-compatible voltage the external power device (115, 120) is preferably directly connected to the power bus without any power conversion. Thus power sources and power loads that can operate at the bus-compatible voltage can be directly connected to the power bus (105) over any one of the device ports (110) or (130) without the need for a voltage conversion. This is demonstrated in FIG. 2 which shows a schematic representation of a pair of input device ports (130a) and (130b) each connectable to the power bus (105) over two different connection paths and a pair of output device port (110a) and (110b) each connectable to the power bus (105) over two different connection paths. As shown, each input device port (130a, 130b) includes a first power channel (1080) that extends between the device port (130a) and the power bus (105) and another first power channel (1085) that extends between the device port (130b) and the power bus (105). As also shown each first power channel (1080, 1085) includes a first controllable switch (1040) disposed between port (130a) and the power bus and first controllable switch (1030) disposed between port (130b) and the power bus. Similarly each output port (110a, 110b) also includes a first power channel (1090, 1095) and a first controllable switch (1055) disposed between the output port (110a) and the power bus (105). Thus all six device ports include a first power channel for directly connecting an external device connected to the device port to the power bus when the first controllable switch is closed.

In operation the first controllable switch is opened preventing the external device from connecting with the power bus (105). The electronic controller (125) communicates with each external power source (115a, 115b) and with each external power load (120a, 120b) to determine operating voltages of each externally connected power device. If any of the connected external devices are operable at the bus compatible voltage the electronic controller (125) can actuate (close) the relevant first controllable switching elements (1030, 1040, 1055, 1060) to directly connect all of the external devices that can operate at the bus voltage to the power bus if other conditions of the energy management schema justify the connection. Moreover in the case where a power source or a power load is operable at the bus compatible voltage power sources (115a, 115b) and the power loads (110a, 110b) are interchangeable between the input device ports (130a, 130b) and the output ports (110a, 110b). More generally every device port (110) can be used as in input device port or an output device port when the connected external device is operable at the bus-compatible voltage.

Alternately when a connected external device is not operable at the bus-compatible voltage it can be connected to the power bus over a DC to DC power converter when the power converter is configurable to perform a suitable voltage conversion. This is demonstrated in FIG. 2 wherein the two input device ports (130a, 130b) share a single input power converter (1065) and the two output device ports (110a, 110b) share a single output power converter (1070).

Each power converter (1065) and (1070) is unidirectional such that the power converter (1065) can only make a power conversion on an input power signal received from a power source (115a, 115b) and the power converter (1070) can only make a power conversion on an output power signal received from the power bus (105).

The input ports (115a, 115b) share the input power converter (1065) over a second power channel (1075). The channel (1075) is accessed by the device port (130a) by opening the switches (1040) and (1035) while closing the switch (1025) such that a power signal received through the input device port (130a) flows over the second power channel (1075) and through the power converter (1065) to the power bus (105). The channel (1075) can also be access by the device port (130b) by opening the switches (1030) and (1025) and closing the switch (1035) such that a power signal received through the input device port (130b) flows over the second power channel (1075) and through the power converter (1065) to the power bus (105). Thus one of the two input power sources (115a) and (115b) can be connected to the power bus over the input power converter via the second power channel (1075), both of the two input power sources (115a) and (115b) can be connected to the power bus over the two first power channels (1080) and (1085) or one of the two input power sources (115a) and (115b) can be connected to the power bus over the input power converter via the second power channel (1075) while the other of the two input power sources (115a) and (115b) is connected to the power bus over the relative first channel (1080) or (1085).

Similarly the output ports (110a, 110b) share the output power converter (1070) over a second power channel (1097). The channel (1097) is accessed by the device port (110a) by opening the switches (1045) and (1055) while closing the switch (1050) such that a power signal flowing from the power bus (105) to the output port (110a) flows through the output power converter (1070) and over the second power channel (1095) to the power load (120a). The channel (1075) can also be accessed by the device port (110b) by opening the switches (1050) and (1060) and closing the switch (1045) such that a power signal flowing from the power bus (105) to the output port (110b) flows through the output power converter (1070) and over the second power channel (1095) to the power load (120b).

Thus one of the two power loads (120a) and (120b) can be connected to the power bus over the output power converter via the second power channel (1097), both of the two power loads (120a) and (120b) can be connected to the power bus over the two first power channels (1090) and (1095) or one of the two power loads (120a) and (120b) can be connected to the power bus over the output power converter via the second power channel (1095) while the other of the two power loads (120a) and (120b) is connected to the power bus over the relative first channel (1090) or (1095). While not shown in FIG. 2 the remaining pair of output device ports (totaling six ports) is configured like the output device ports (110a) and (110b). Thus all six device ports of the device (100) include a first power channel for directly connecting an external device connected to the device port to the power bus when the first controllable switch disposed along the first power channel is closed. Meanwhile at the two input device ports (130a) and (130b) share an input power converter and each pair of output device ports shares an output power converter.

2.2.1 Empty Input Device Ports not Utilized

Accordingly one problem with the device disclosed by Robinson et al. is that for a given pair of device ports only one of the device ports has access to a power converter. In the case of the input device ports (130a, 130b) the input power converter (1065) can operate with one power conversion setting, e.g. to step up or step down the input voltage to match the bus voltage. Thus if two input sources are available and each has a different non-bus compatible operating voltage, only one of the two input sources is usable and one of the input device ports is available. While the unused input port can be used as an output port for a power load that is bus voltage compatible there is no opportunity to use the empty input port for a non-bus compatible voltage device. The problem also extends to the output side. As a result one of the input ports is not usable. In the case of the output device ports (110a, 110b) and other pairs on the power manager, the output power converters (1065) can operate with one power conversion setting, e.g. to step up or step down the bus voltage to match the connected non-bus voltage compatible power load. Thus if two power loads are in need of power and each has a different non-bus compatible operating voltage, only one of the two power loads can be powered and one of the two output device ports associated with the output power converter is available. While the unused output port can be used as an output port for a power load that is bus voltage compatible there is no opportunity to use the empty output port for a non-bus compatible voltage device.

Thus one problem that arises with conventional power managers that do not include a power converter for each device ports is that not all the available device ports can be utilized to power loads that require a power conversion. In one example, the bus is powered by a single power source connected to one of the input device ports (130a, 130b) and there are more than four power loads that need power. In this example four power loads may be able to be powered at the four output ports (110) but one of the input ports (130) is empty. While the empty input port can be utilized to power a load with a bus compatible operating voltage there is a need to utilize the empty input port to power a load that needs a power conversion. More generally there is a need to utilize empty input and output device ports to power loads that require a power conversion.

2.2.2 Power Loss Resulting from Each Power Conversion

A further problem in the art relates to suffering power losses associated with each power conversion. As is well known, each power conversion (e.g. a buck/boost converter) has an associated power loss in proportion to the input and output voltage and the input and output current amplitude. The power loss for such a conversion for a defined set of input and output currents can be approximated by:

$$PLoss = Ls(|Vin - Vout|) \qquad \text{Equation 1}$$

where the power loss PLoss is the power lost due to the voltage conversion for given input and output current amplitudes, Ls is a loss factor associated with the particular power converter or type of power converter, Vin is the input voltage, and Vout is the output voltage. Thus the power loss is directly proportional to the step up or step down voltage.

2.2.3 Fixed Bus Voltage can Lead to Power Loss

When a power manager (e.g. 200) is operated with a fixed bus voltage, unnecessarily large step up and step down voltage conversions are sometimes performed, leading to unnecessary power loss. Moreover, as described above, operating a power manager with a fixed bus voltage can lead to empty device ports that are not usable to power loads. Since all the device ports of the device shown in FIG. 2 include a power channel to directly connect a power device to the power bus without a power conversion, allowing the bus voltage to match the voltage of at least some of the power devices connected to the power bus can help to avoid power conversions. Alternately reducing the step up or step down voltage at each converter can also reduce power conversion losses.

In a conventional operating mode, a fixed bus voltage ranges from 12-16 volts, but the user has a 30 volt power supply and a plurality of 30 volt power loads that need to be connected to the power manager. In this case, each 30 volt device requires a power conversion to connect to the power bus. When each device is power converted, power losses occur at each device port. Given that in many cases, power managers are used in remote locations to simultaneously power a plurality of power loads using limited input power resources, a power loss at every device port is not desirable. Thus, there is a need in the art for a power manager that can adapt its bus voltage according to the configuration of power devices connected to it to reduce power loss and maximize device port utilization.

3 SUMMARY OF THE INVENTION

In view of the problems associated with conventional methods and apparatus set forth above, it is an object of the present invention to improve device port utilization by making more device ports available to power additional non-bus voltage compatible power loads.

It is a further object of the invention to reduce power loss associated with power conversions by performing fewer power conversions.

It is a further object of the invention to reduce power loss when power conversions are performed by reducing the quantity |Vin−Vout| listed in Equation 1.

It is a still further object of the present invention to provide a power manager that operates at a plurality of different bus voltage operating points.

It is a still further object of the present invention to determine a bus voltage operating point that reduces power loss according to the operating voltages of connected power devices.

4 BRIEF DESCRIPTION OF THE DRAWINGS

The features of the present invention will best be understood from a detailed description of the invention and example embodiments thereof selected for the purposes of illustration and shown in the accompanying drawings in which.

5 DESCRIPTION OF SOME EMBODIMENTS OF THE INVENTION

5.1 Overview

5.1.1 Expanded Access to Power Converted Output

In exemplary, non-limiting, embodiments of the invention an improved power manager operating with a fixed bus voltage includes additional power channels and related control elements for routing power from an output power converter to a plurality of device ports, including to device ports associated with an input power converter. The additional power channels allow a user of the power manager to connect power loads to input device ports even when the power load connected to the input device port operates with a non-bus compatible voltage. In one example embodiment shown in FIG. 3, a single input device (115*b*) is used to power three power loads (110*a*, 110*b*, 110*c*) over a single output converter (3070), as illustrated by bold arrows, indicating flow of power from power source (115*b*) to power loads (110*a*, 110*b*, 110*c*). This in an improvement over conventional power manager (200) which is limited to powering only two power loads (110*a*, 110*b*) over a single power converter (1070).

Figure 4:
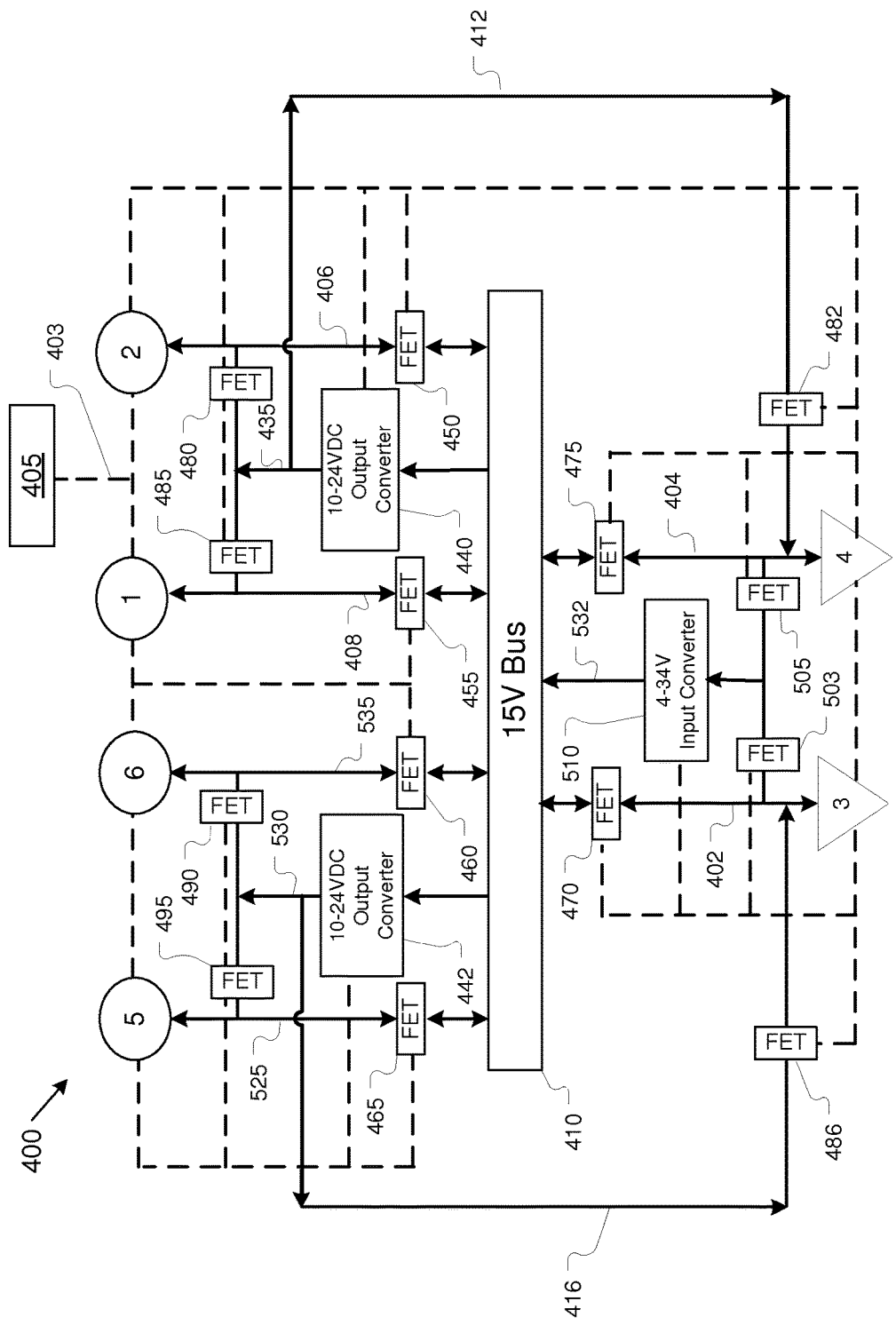
FIG. 4 illustrates a schematic diagram representing a second non-limiting exemplary embodiment of a power manager having an improved power channel layout and control system according to the present invention.

In a further example shown in FIG. 4, a single input source connected to power manager (400) at device port (3) is used to power three power loads, power loads at ports (1, 2, and 6), over a single output power converter (440) by providing an additional power channel (414) and associated controllable switch (484). This is an improvement over conventional power managers which are limited to powering only two power loads over a single power converter. In further embodiments, additional power channels are provided to power more than three device ports through a single output power converter (440). Meanwhile each of the device ports of the improved systems (300) and (400) each includes a first power channel and first controllable switch provided to connect any bus compatible voltage power device connected to any device port to the power bus without passing over a power converter.

5.1.2 Bus Voltage Varied to Reduce Power Conversion Losses

Figure 5:
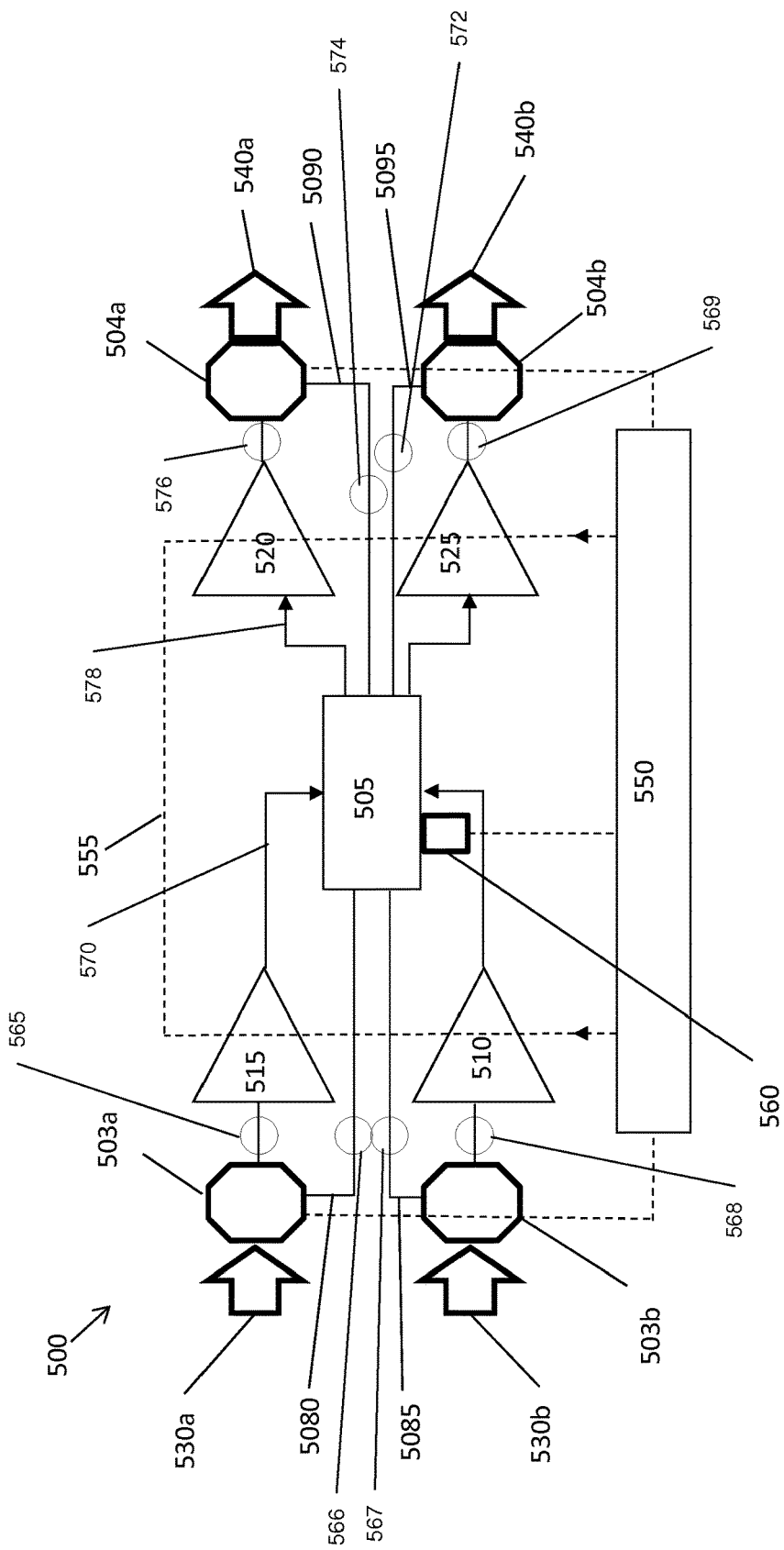
FIG. 5 illustrates a schematic diagram representing a third non-limiting exemplary embodiment of an improved power manager having a variable voltage power bus according to one aspect of the present invention.

In exemplary, non-limiting, embodiment of the invention an improved power manager (500), shown in FIG. 5, manages the device bus voltage according to the collective operating voltages of external power devices connected to the power bus. The power manager further includes an electronic controller and a communications interface module wherein the communications interface module connects the electronic controller to the each device port, to sensors measuring power conditions on the power bus and to other components of the power manager. The controller receives information regarding the external devices connected to the power manager and controls components of the power manager to set the bus voltage, to set power conversion parameters of the power converters, and to connect and disconnect device ports to and from the power bus according to an energy management schema. The controller is further configured to collect operating voltage parameters of each external power device connected to a device port and to calculate a bus voltage that minimizes power losses due to power conversions required by power converters to connect power devices to the power bus. The need for a power manager that reduces power losses due to power conversions is met by providing a power manager with a variable bus voltage wherein the bus voltage is set to a value that minimizes power losses due to conversion of input and output power to accommodate attached power sources and power loads.

These and other aspects and advantages will become apparent when the Description below is read in conjunction with the accompanying Drawings.

5.2 Item Number List (if Applicable)

The following item numbers are used throughout, unless specifically indicated otherwise.

| # | DESCRIPTION | # | DESCRIPTION |
|---|---|---|---|
| 100 | Power Manager | 400 | Power Manager |
| 105 | Power Bus | 405 | Electronic Controller |
| 120 | Device Port (Output Port) | 403 | Communication Interface |
| 115 | External Device Power Source | 3 | Device Port (Input Port/Universal Port) |
| 110 | External Device Power Load | 4 | Device Port (Input Port/Universal Port) |
| 125 | Electronic Controller | 5 | Device Port (Output Port) |
| 130 | Device Port (Input Port) | 6 | Device Port (Output Port) |
|  |  | 1 | Device Port (Output Port) |
| 200 | Power Manager | 2 | Device Port (Output Port) |
| 205 | Electronic Controller | 410 | Power Bus |
| 210 | Communication Interface | 402 | Direct Power Channel (Port 3) |
| 1065 | Input Power Converter | 404 | Direct Power Channel (Port 4) |
| 1070 | Output Power Converter | 406 | Direct Power Channel (Port 2) |
| 1025 | Switching Element | 408 | Direct Power Channel (Port 1) |
| 1030 | Switching Element | 535 | Direct Power Channel (Port 6) |
| 1035 | Switching Element | 525 | Direct Power Channel (Port 5) |
| 1040 | Switching Element | 470 | FET |
| 1045 | Switching Element | 475 | FET |
| 1050 | Switching Element | 450 | FET |
| 1055 | Switching Element | 455 | FET |
| 1060 | Switching Element | 460 | FET |
| 1080 | Non-Converted Power Channel | 465 | FET |
| 1085 | Non-Converted Power Channel | 510 | Input Power Converter |
| 1090 | Non-Converted Power Channel | 532 | Input Converter Power Channel |
| 1095 | Non-Converted Power Channel | 503 | FET |
| 1075 | First Conductive Channel | 505 | FET |
| 1097 | Second Conductive Channel | 440 | Output Power Converter |
|  |  | 435 | Output Converter Power Channel |
| 300 | Improved Power Manager | 485 | FET |
| 305 | Power Bus | 480 | FET |
| 330 | Universal Port | 442 | Output Power Converter |
| 3080 | Direct Power Channel | 530 | Output Converter Power Channel |
| 3085 | Direct Power Channel | 495 | FET |
| 3090 | Direct Power Channel | 490 | FET |
| 3095 | Direct Power Channel | 412 | Additional Power Channel (Port 4) |
| 3065 | Input Power Converter | 482 | FET |
| 3075 | Input Converter Power Channel | 416 | Additional Power Channel (Port 3) |
| 3070 | Output Power Converter | 486 | FET |
| 3097 | Output Converter Power Channel |  |  |
| 310 | Additional Power Channel | 500 | Power Manager |
| 315 | Controllable Switch | 505 | Power Bus |
| 320 | Controllable Switch | 550 | Electronic Controller |
| 325 | Controllable Switch | 555 | Communication Interface |
|  |  | 560 | Bus Sensor Module |
|  |  | 510 | Input Power Converter |
|  |  | 515 | Input Power Converter |
|  |  | 520 | Output Power Converter |
|  |  | 525 | Output Power Converter |
|  |  | 503 | Input Device Port |
|  |  | 504 | Output Device Port |
|  |  | 530 | Power Source |
|  |  | 540 | Power Load |
|  |  | 5080 | Non-Converter Power Channel |
|  |  | 5085 | Non-Converter Power Channel |
|  |  | 5090 | Non-Converter Power Channel |
|  |  | 5095 | Non-Converter Power Channel |

5.3 Brief Description of the Invention

Figure 1:
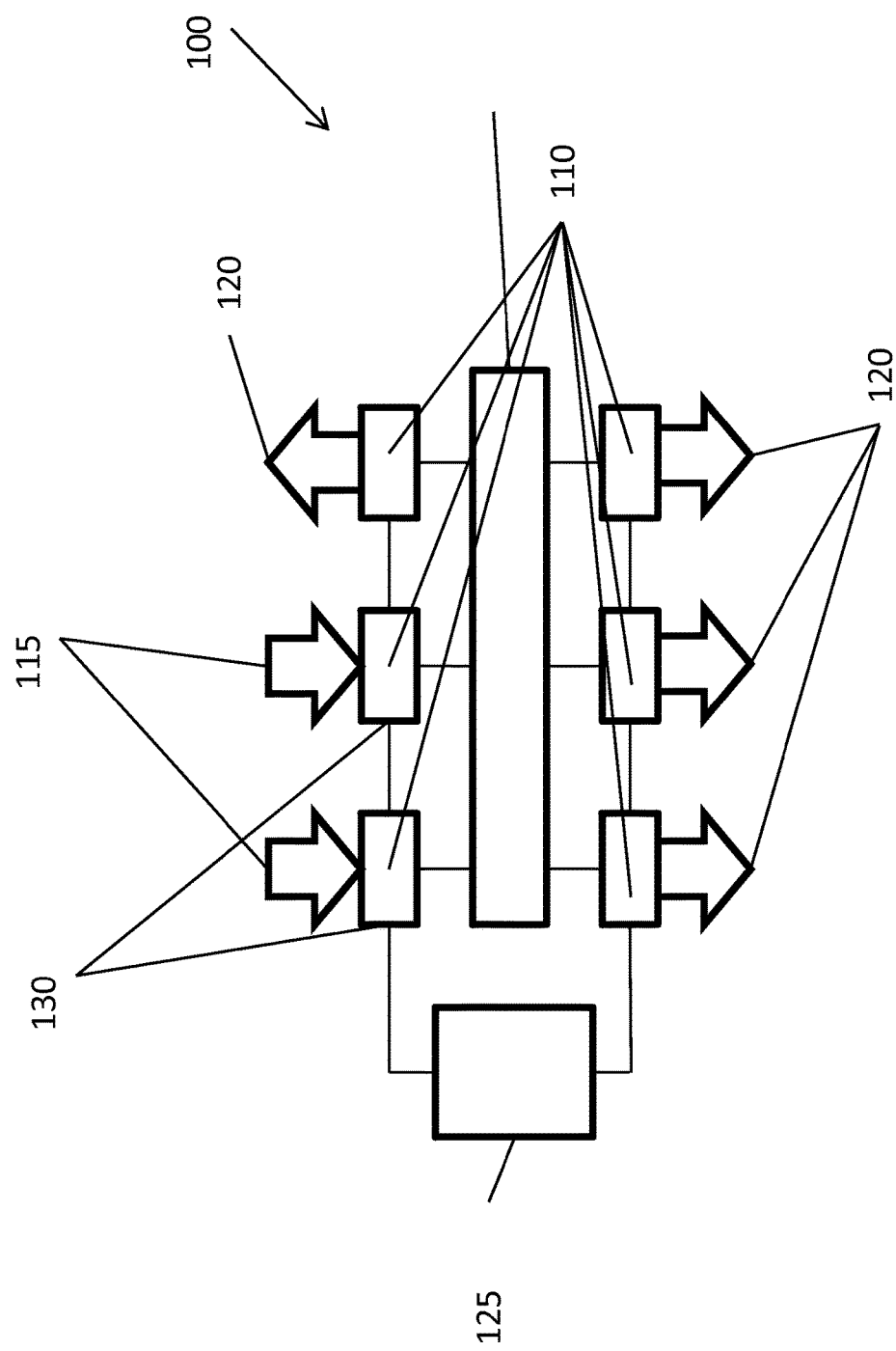
FIG. 1 illustrates a schematic diagram representing a conventional power manager having six device ports connected to a power bus with 2 device ports configured as input ports and four device ports configured as output ports.
Figure 2:
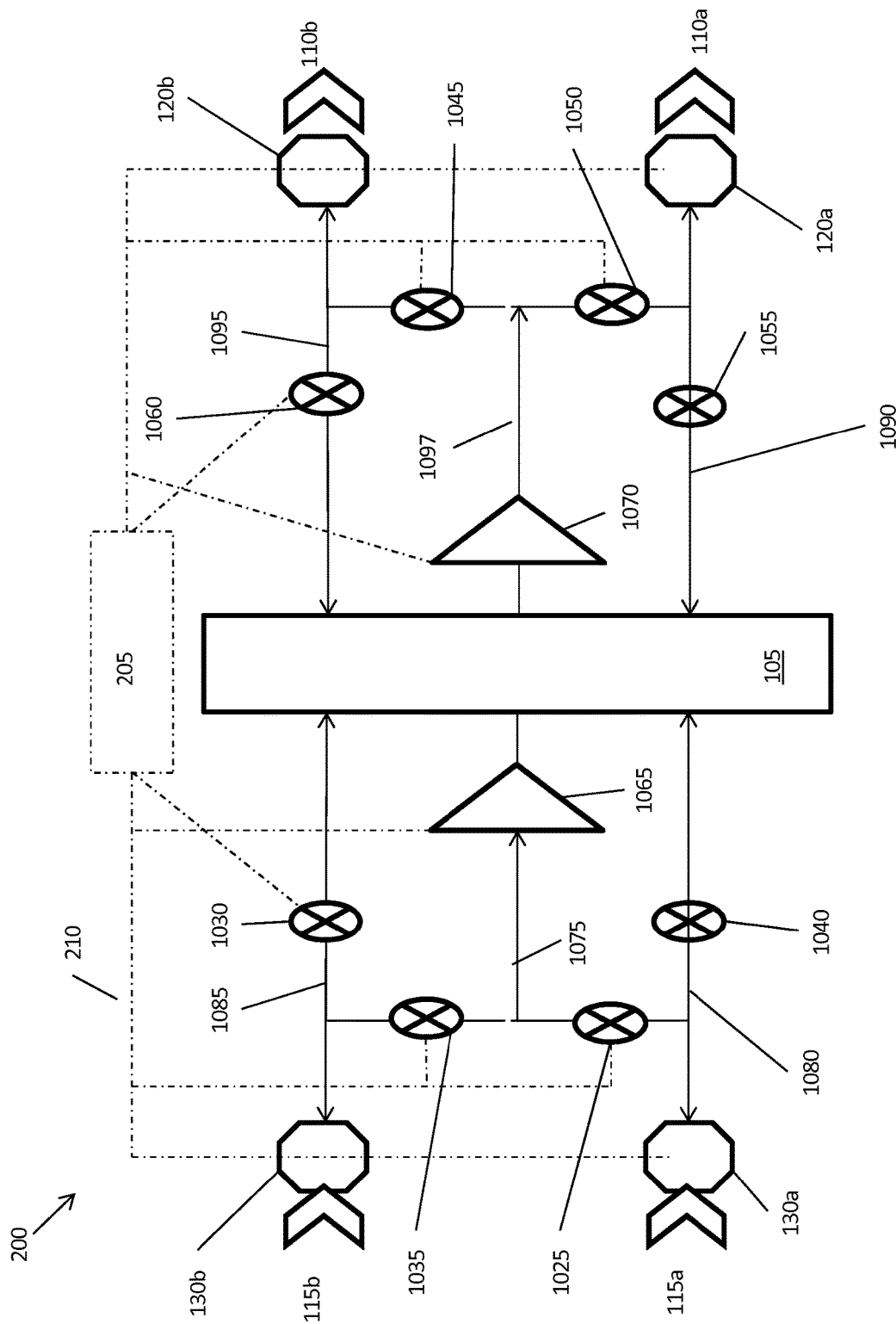
FIG. 2 illustrates a schematic diagram representing a portion of a conventional power manager with two input ports sharing an input power converter and two output ports sharing and output power converter.
Figure 3:
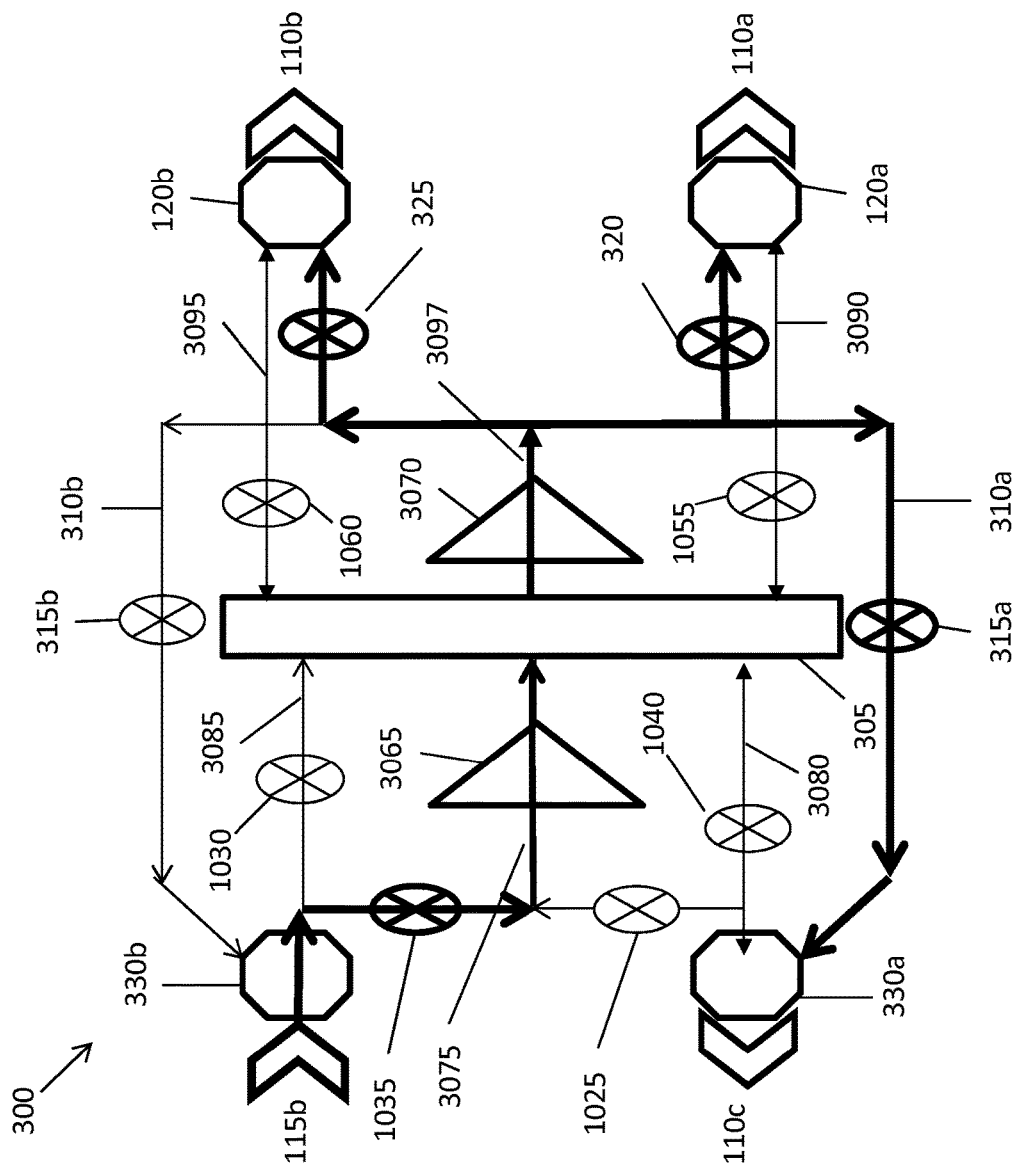
FIG. 3 illustrates a schematic diagram representing a first non-limiting exemplary embodiment of a power manager having an improved power channel layout according to the present invention.

Referring to FIG. 3 an improved power manager (300) according to the present invention comprises a power bus (305) and a plurality of device ports (330, 120) connectable to the power bus over a plurality of independent power channels. Each power channel includes one or more control devices such as controllable switches (e.g., 1030, 1035, 1060, 325) and controllable DC to DC power converters (3065, 3070) in communication with an electronic controller (350). The electronic control may comprise a microprocessor or the like, and a separate or integrated data storage module (352) in communication with the electronic controller (350). In addition a communications interface (354) such as SMbus or the like extends to each device port to communicate with external power devices connected with the device ports. In addition the communications interface (354) further includes elements that interconnect operable and passive electronic devices within the power manager to the electronic controller (350) as required to operate switches, to operate the power converters (3065) and (3070), and to collect data from sensors and other electronic components.

Device ports (120a, 120b, 330a, 330b) are configured to interface with external power devices which may comprise power sources, power loads, or rechargeable batteries (energy sources). Rechargeable batteries may operate as an energy source when discharging to the power bus or as a power load when recharging or drawing power from the power bus. Throughout the specification when a power load is referenced it is understood that the term power load may encompass a rechargeable battery or other rechargeable energy storage device that is recharging or otherwise drawing power from the power bus (305). Similarly, the term power source is understood to encompass rechargeable batteries or other rechargeable power devices that are discharging power to the power bus (305). It is further noted that in a preferred embodiment each device port comprises a physical connector or plug suitable for connecting to an external power device over a wire or cable that is terminated by a connector or plug suitable for mating with the device port such that external devices are easily connected to or disconnected from device ports. It is further noted the preferred power manager (300) is a portable or more specifically man portable device and that the preferred power manager is a DC to DC device exchanging power only with other DC devices or devices that are converted to a suitable DC power signal. Additionally it is noted that the preferred device port includes a wire network channel such that the power managers can at least receive digital data from each external device connected to a device port over a wire network interface using a network protocol such as SMbus, RS232, USB and the like.

In one example embodiment, the power bus operates with a substantially fixed bus voltage although the embodiment of FIG. 3 is not limited to a fixed bus voltage device. The power manager includes control elements and programs stored on the data storage module (352) and operable on the electronic controller (350) for communicating with external power devices connected to device ports over the communication interface (354) to ascertain the device power characteristics, including a type and operating voltage range of each connected external power device. If the external power device is bus-voltage compatible (i.e. has an operating voltage that overlaps with the power bus voltage) the external device can be directly connected to the power bus over a direct power channel (e.g. 3080, 3085, 3090, 3095) by closing appropriate control switches (e.g. 1030, 1040, 1055, 1060) and opening appropriate controllable switches (e.g. 1025, 1035, 320, 325, 315a and 315b). Additionally, the electronic controller (350) operates energy management schema programs that select which external power devices to connect to the power bus (305) or to disconnect from the power bus (305) according to the overall operating configuration and operating mode of the power manager (300).

If the external power device does not have a bus-voltage compatible operating voltage the external device can be connected to the power bus over a power converter channel (e.g. 3075, 3097) that includes an input power converter (3065) for converting the input voltage of a power source to a bus compatible voltage converting or an output power converter (3070) for converting bus voltage to a suitable output voltage for powering a connected a power load. On the input side the input power converter (3065) can be configured to convert an input power signal by either stepping the input voltage up or stepping the input voltage down as required to match the bus voltage. In the present example, switch (1035) is closed and switches (1025) and (1030) are opened in order to direct input power from the power source (115b) to the power bus over the input power converter channel (3070) which passes through the input power converter (3065). In another operating mode wherein the power source (115b) has a bus compatible voltage the port (330b) is connected directly to the power bus (305) without power conversion by opening the switches (1035) and (315b) while closing the switch (1030).

The input and output power converters (3065) and (3070) are each controlled by the electronic controller (350) and are each operable to step the input voltage up or down as well as to modulate power amplitude. Additional each device is unidirectional with the input voltage of the input power converter (3065) coming from the input ports (330a, 330b) and the input voltage of the output power converter (3070) coming from the power bus (305). Generally the power converters operate to modulate power amplitude passing over the power converter between a substantially zero and a maximum available power amplitude. Moreover the power converters substantially prevent power from passing from the output side to the input side.

Two power sources (115a) and (115b) each having the same non-bus compatible voltage can be, connected one to each of the device ports (330a) and (330b), and power converted simultaneously by directing the input power from each of the device ports (330a) and (330b) over the power converter channel (3075) to the power converter (3065) as long as both external power sources require the same power conversion. In this example configuration, two power sources are connected to the power bus (305) over the power channel (3075) by opening and closing appropriate control switches and by configuring the power converter (3065) for the desired power conversion. In particular this is possible when switches (315b), (315a), (1030) and (1040) are open and switches (1035) and (1025) are closed. It is further noted that the power converter channel (3070) extends from the power bus (305) through the input power converter (3065) and branches onto tow paths to connect with each device port (330a) and (330b).

On the output side of the power bus the output power converter (3070) can be configured to power convert a power signal output from the power bus (305) to power an external power load connected to either one or both of the device ports (120a or 120b) over an output power converter channel (3097). In particular the output power converter channel (3097) extends from the power bus to the output power converter (3070) and then in two branches to each of the output device ports (120b) and (120a). In addition the power channel (3097) includes two controllable switches (325) and (320) which can be opened to disconnect a corresponding device port from the power bus or closed to connect a corresponding device port to the power bus over the output power converter. Accordingly, each of the external power loads (110a) and (110b) connected to the device port (120a and 120b) can be connected to the power bus over the output power converter (3070) when both loads (110a and 110b) have the same non-bus compatible operating voltage. In either case the devices (110a and 110b) are connected to the power bus (305) over the output power converter channel (3097) by opening and closing appropriate control switches and by configuring the output power converter (3070) for the desired power conversion.

As is the case on the input side, either or both of the output device ports (120a) and (120b) can be connected directly to the power bus (305) without power conversion. In the case of output device port (120a) any power device that operates with a bus compatible voltage can be connected to the power bus over the power channel (3095) by opening switches (325) and (315b) and closing switch (1060). In the case of output device port (120b) any power device that operates with a bus compatible voltage can be connected to the power bus over the power channel (3090) by opening switches (320) and (315*a*) and closing switch (1055).

In a further aspect of the present invention two additional power channels (310*a* and 310*b*) are disposed, one each, from the output of the power converter (3070) to two universal device ports (330*a* and 330*b*) respectively. Each power channel (310*a* and 310*b*) includes a controllable switch (315*a*, 315*b*) in communication with the electronic controller (350) for opening and closing each switch to connect or disconnect the appropriate power channel (310*a* or 310*b*) to deliver power to a power load connected to one of the universal device ports (330*a* or 330*b*) or both. In particular the present invention and specifically the power channels (310*a*) and (310*b*) allow the input ports (330*a*) and (330*b*) to operate as universal port capable of being used as an input port for input power sources that require power conversion by an input power converter or as an output port for power loads that require power conversion by an output power converter.

In one operating example a power source (115*b*) is connected to the power bus (305) over the input power converter (3065) through power channel (3075). Alternately the power source (115*b*) can be directly connected to the power bus (305) over the power channel (3085) if the power source has bus compatible operating voltage. On the output side, the power load (110*a*) is connected to the power bus (305) over the power converter (3070) by power channel (3097). Alternately or additionally the power load (110*b*) is also connected to the power bus (305) over the power converter (3070) by the power channel (3097). In addition the power channel (3097) extends to power channel (310*a*) when switch (315*a*) is closed such that a power load (110*c*) connected to the device port (330*a*) is also connected to the power bus over the output power converter (3070). In alternative operating modes, one or both of the power devices (110*a*, 110*b*) can be directly connected to the power bus (305) without a power conversion over the power channels (3090 and 3095) respectively and in that case one or both of the power devices (110*a* and 110*b*) may comprise a power load or a power source or a rechargeable battery. In a further alternate operating mode the input power source (115*b*) can be exchanged with a power load and connected to the power bus over the output power converter (3070) using the power channel (310*b*) when switch (315*b*) is closed.

In another exemplary operating mode, either one or both of device port (330*a*) and device port (330*b*) can be connected to bus (305) over power channels (310*a*) and/or (310*b*), respectively, while one, both, or neither of device ports (120*a*, 120*b*) are simultaneously connected to the power bus over output power converter (3070). In an exemplary operating mode one or both of device ports (120*a*, 120*b*), includes a connected power source having a bus compatible voltage and the respective device port is connected to the bus (305) over a non-converted power channel (3095, 3090). In such an operating configuration one or both of device ports (330*a*, 330*b*) may be connected to bus (305) through output power converter (3070) over channels (310*a*, 310*b*). Thus using a single power source having a bus compatible voltage connected to e.g. port (120*b*) and directly connected to the power bus (305) over the channel (3095) up to three power loads having the same non-bus compatible operating voltage can be powered from the output power converter (3070).

The power channel (3097) extends from the output end of a power converter (3070) to each of the device ports (120*a* and 120*b*) and includes controllable switches (320 and 325) for connecting or disconnecting the devices (110*a* and 110*b*) as required. The additional power channels (310*a* and 310*b*) extend the power channel (3097) to the device ports (330*a* and 330*b*) and include additional controllable switches (315*a* and 315*b*) for connecting or disconnecting the device ports (330*a*) and (330*b*) to the output converter (3070) as required.

Thus the improved power manager (300) includes at least one universal port, (e.g. 330*a* or 330*b*), capable of operating as an input port or an output port with selectable input or output power conversion. Specifically, when a power device connected to the universal port (330*a*) is determined to be a power source, the power source is either directly connected to the power bus over the power channel (3080) when no power conversion is required, or the power source is connected to the power bus over the input power converter (3065) using the power channel (3075), if the input power converter is available, i.e. not already in use or not able to make the desired power conversion. Conversely, when a power device connected to the universal port (330*a*) is determined to be a power load, the power load is either directly connected to the power bus over the power channel (3080) when no power conversion is required, or the power load is connected to the power bus over the output power converter (3070) if it is available, i.e. not already in use or not able to make the desired power conversion. In particular the electronic controller (350) checks the status of the output power converter (3070) to determine if it can be configured to connect a power load connected to the universal device port (330*a*) to the power device. If the power converter is available (i.e. either not in use or not in use at a non-compatible power conversion setting), the power converter is configured with appropriate power conversion parameters to power he load connected to the universal port (330*a*) and the switch (315*a*) is closed to connect the power load (110*c*) to the power bus over the power converter (3070). Meanwhile other switches that are opened or remain opened include (1040), (315*b*) and possibly (320) and (325) depending on the external devices are connected to device ports (120*a*) and (120*b*).

In operation, all the control switches in the power manager (300) are initially opened to prevent current flow over any of the power channels. The electronic controller (350) then polls all of the device ports and determines if an external power device is connected and the power device type and power characteristics of each connected power device. Once the device types and characteristics are determined the energy management schema selects a system configuration which includes generating a list of external devices to connect to the power bus, determining the power conversion settings of each power converter, determining which power channel each device will be connected to the power bus over and determining which switches to open and close. Thereafter the electronic controller (350) periodically polls all of the device ports to update configuration information and the energy management schema operates to adjust the connected power device configuration according to program parameters. Additionally the electronic controller (350) initiates the polling process whenever a change in device configuration is detected, e.g. if an external device is connected or disconnected.

Typical example power and energy sources (115) include energy storage devices such as batteries; a grid power source (e.g. a wall outlet converted to DC power); mechanically driven power generators (such as fossil fuel engines, wind, water, or other mechanically driven power generators); and/or current generators such as photovoltaic and electrochemical devices. Example power loads (110) include any device powered by electricity, but usually include portable electronic devices that operate on a rechargeable DC battery or that operate on DC power received from the power manager. In some instances, an input power source may use an additional power conversion to become compatible with the power manager. For example, if an AC power grid is available (120 volts alternating at 60 Hz or 240 volts at 50 Hz), an additional external power converter is used to invert the AC current and step the AC voltage down from the grid voltage to a DC voltage that is either directly compatible with the power bus voltage range or that can be converted to the power bus voltage range using the DC to DC input power converter (3065). However, it is within the scope of the present invention to include a power converter within the power manager (300) that is configured to convert various AC power grid signals to a power signal that is compatible with power bus voltage range.

5.3.1 Power Manager with Six Ports

Referring now to FIG. 4, a power manager (400) comprises six device ports (1-6) operably connectable to a DC power bus (410). The power bus is operating at 15 volts DC with some moderate voltage variability around 15 volts (e.g. +/−3 volts) and is suitable for direct connection with external power devices having an operating voltage in the range of 15+/−3 volts. Each of the six device ports can be directly connected to the power bus (410) over a direct power channel (402, 404, 406, 408, 535, and 525) respectively by closing controllable switches or field-effect-transistor (FET), (470, 475, 450, 455, 460, and 465) disposed on each of the direct power channels between corresponding the device ports and the power bus. Each direct power channel extend from the device port to the power bus without power conversion and is used if the external device is operable at a bus compatible voltage e.g. 15+/−3 volts, i.e. when the external device is bus-voltage compatible. In the case where the external device is bus voltage compatible, the external device is operable as a power source or as a power load irrespective of whether the external device is connected to an input port or an output port. Power manager (400) includes an electronic controller (405) and associated communication interface (403), shown by dashed lines, electrically interfaced to each device port (1-6), to each power converter (510, 440, 442), and to each FET, (e.g. 503, 505, 480, 485, 482, 486, 490, 495). The communication interface (403) include a variety of network communication paths suitable for digital data communications, e.g. between the electronic controller (405) and external devices connected to device ports as well as other conductive paths or the like suitable for exchanging analog signals and or digital control signals e.g. with FET's voltage converters, sensors and other components of the power manager.

The power manager (400) includes two input ports (3, 4) associated with a single unidirectional input power converter (510). The input power converter (510) has an input power conversion range (step up or step down) of 4 to 34 volts. Either of the input ports (3, 4) is usable to connect an external power device to the power bus (410) over the power converter channel (532) that includes the power converter (510). Thus a non-bus voltage compatible power source connected to either one of the input ports (3) and (4) can be connected to the power bus (410) over the power converter (510) by closing either FET (503 or 505) when the power converter is operating at an appropriate step up or step down voltage. However the power converter (510) can only be used by one of the device ports (3) and (4) unless each device port is connected to a power source that requires the same power conversion setting to connect to the power bus. For example if substantially identical 24 volt power sources are connected to each of the device ports (3) and (4), each power source can be connected to the power bus with a 9 volt step down conversion and both devices can be simultaneously connected to the power bus over the power converter (510) by closing both FETs (503, 505) At the same time, each of the FET's (486, 470, 482, 475) is opened to disconnect the channels (416, 402, 404, 412) from the input device ports (3, 4).

The power manager (400) includes four output ports (1, 2) and (5, 6) each operably connectable to the power bus (410) and to external power devices suitable for connecting to the power bus. Output ports (1) and (2) are associated with a single unidirectional output power converter (440) disposed along an output power converter channel (435) which extends from the power bus to the output power converter (440) and branches to each of the ports (1, 2) over control switches (485) and (480). Output ports (5) and (6) are associated with a single unidirectional output power converter (442) disposed along an output power converter channel (530) which extends from the power bus to the out power converter (442) and branches to each of the ports (5, 6) over control switches (495) and (490). Each of the output power converters (440, 442) has an output power conversion range (step up or step down) of 10 to 24 volts. Either of the output ports (1, 2) is usable to connect an external power load to the power bus (410) over the output converter power channel (435) that includes the output power converter (440). It is noted that the converter power channel (435) is shared by the two ports (1, 2) and therefore can only be used for a single power conversion by one of the device ports (1, 2) unless both of the device ports can use the same power conversion. The output converter power channel (435) is accessed by port (1) by closing FET (485) and opening FET's (480), (455), (484) and (482).

Either of the output ports (5, 6) is usable to connect an external power load to the power bus over the output power converter channel (530) that includes the output power converter (442). It is noted that the output power converter channel (530) is shared by the two ports (5, 6) and therefore can only be used for a single power conversion by one of the device ports (5, 6) unless both device ports can use the same power conversion. The output power conversion channel (530) is accessed by port (6) by closing FET (490) and opening FET's (495), (460), (484) and (486).

The power manager (400) further includes a power channel (412) that extends from the output of power converter (440) by branching from converter power channel (435) to the input port (4) by branching to the device power channel (404). The power channel (412) allows a power load connected to input device port device port (4) to be connected to the power bus (410) over the output power converter (440). In addition the power manager (400) also includes a power channel (416) that extends from the output of power converter (442) by branching from converter power channel (530) to the input port (3) by branching to the device power channel (402). The power channel (416) allows a power load connected to input device port device port (3) to be connected to the power bus (410) over the output power converter (442). In addition, the power manager (400) also includes a power channel (414) that extends from the output of power converter (440) by branching from converter power channel (435) to both of the output ports (5) and (6) by branching to the device power channel (530). The power channel (414) allows a power load connected to either of the output device ports (5) or (6) to be connected to the power bus (410) over the output power converter (440). Alternately The power channel (416) can be used to connect a power load connected to either of the device ports (1) and (2) to the power bus over the output power converter (442).

In operation, the electronic controller (405) polls each device port to detect connected external power devices and the power device type and power characteristics of each connected power device. Once the device types and characteristics are determined the energy management schema selects a system configuration which includes generating a list of external devices to connect to the power bus, determining the power conversion settings of each power converter, determining which power channel each external power device will be connected to the power bus over and determining which switches to open and close. Thereafter the electronic controller (350) periodically polls all of the device ports to update configuration information and the energy management schema operates to adjust the connected power device configuration and power distribution according to program parameters. Additionally the electronic controller (405) initiates the polling process whenever a change in device configuration is detected, e.g. if an external device is connected or disconnected.

5.3.2 Power Manager Operating with a Variable Power Bus Voltage:

Referring now to FIG. 5, a power manager (500) is depicted schematically and includes a power bus (505) interfaced with a plurality of input power converters (510, 515) and a plurality of output power converters (520, 525). Each input power converter is associated with an input device port (503) for interfacing with an external power source (530) and each output power converter is associated with an output device port (504) for interfacing with an external power load (540). In alternate embodiments two or more ports may share a single power converter.

Each input device port (504) is connected to the power bus (505) over an input converter power channel (570) which includes a controllable switch (565) in communication with an electronic controller (550). The input converter channel (570) extends from the input device port (503a) to the input power converter (515) over the controllable switch (565) and continues from the output of the power converter (515) to the power bus (505). Since the input converter is unidirectional power conversion is only performed to change input voltage. Specifically the voltage of an input power signal received from an external power source (530a) connected to the input device port (503a) can be stepped up or stepped down to match the operating voltage of the power bus. The switch (565) is operable by the electronic controller (550) to connect the external power source (530a) to the power bus over the input power converter (515) by closing the switch (565) and to disconnect the input device port (503a) by opening the switch (565). Other converter input power channels have the same configuration.

Each output device port (504) is connected to the power bus (505) over an output converter power channel (578) which includes a controllable switch (576) in communication with the electronic controller (550). The output converter channel (578) extends from the output device port (504a) to the output power converter (520) over the controllable switch (576) and continues from the output of the power converter (520) to the power bus (505). Since the output converter is unidirectional power conversion is only performed to change output voltage. Specifically the voltage of a power bus signal received from the power bus (505) can be stepped up or stepped down to match the operating voltage of ab external power load (540a) connected to the device port (504a). The switch (576) is operable by the electronic controller (550) to connect the external power source (540a) to the power bus over the output power converter (520) by closing the switch (576) and to disconnect the output device port (540a) by opening the switch (576). Other converter output power channels have the same configuration.

Power manager (500) includes a non-converting power channel (5080, 5085, 5090, and 5095) associated with each device port (503a, 503b, 504a, 504b). The non-converting power channels are used to connect device ports and any external power sources (530a, 530b) and external power loads (540a, 540b) connected to device ports to the power bus. Each converted and non-converted power channel includes at least one controllable switching element (565, 566, 567, 568, 569, 572, 574, 578) that enables each power channel to be connected to or disconnected from the power bus. In additional embodiments, two or more input ports (503) or output ports (504) may share a single power converter as shown in FIGS. 3 and 4 above. In further embodiments, one or more input ports (503) may be configured as a universal port, i.e., selectively connectable to the power bus over an input power converter or an output power converter, for example with a configuration similar to that shown for ports (330) in FIG. 3.

An electronic controller (550) includes an associated data storage module and communication elements (555) suitable for exchanging command and control signals and data signals with internal devises such as the controllable switches (565, 566, 567, 568, 569, 572, 574, 578), the power converters (510, 515, 520, 525) the bus sensor module (560) and other internal modules as may be present. In addiction the communication elements include a communication interface that extends between the electronic controller (550) and each device port (503, 504). Moreover each device port is configured as a connector or terminator that includes both power and communication channels suitable for connecting with external power sources (530a, 530b), the power loads (540a, 540b). Preferably the communication elements (555) includes at least one network channel for data communication using a network protocol such as SMbus, USB, or the like for communicating with external devices. Otherwise the communication elements may comprise conductive paths, wires or the like, for exchanging analog signals between electronic components of the power manager, e.g. switches, sensors and power converters and the electronic controller (550).

According to the present invention, the electronic controller (550) includes various modules operating thereon, including a data storage module, for operating an energy management schema suitable for changing operating parameters of power manager elements e.g. to determine which external device(s) to connect to the power bus over which power channels and how power should be distributed as well as to alter an operating voltage of the power bus (505) in a manner that reduces power conversion loss. In one example embodiment, the electronic controller includes programs operating thereon for operating the power bus (505) at one of a plurality of different operating voltages, as well as for reconfiguring power converters and device port connections to the power bus in response in a change in power bus voltage.

In one example embodiment, the electronic controller (550) includes a look up table or the like stored in the memory module that lists a plurality of discreet bus voltage operating points, including a default bus voltage operating voltage. The preselected list of bus voltage operating points is chosen to match the operating range of the various power converters (510, 515, 520, and 525). Thus, if all of the power converters are capable of making power conversions over a voltage range of 5 to 50 volts, the list of potential power bus voltages may include operating points within the 5 to 50 volt range that tend to match standard source/load voltages such as 6, 12, 24, 30, and 42 volts. Alternately, the power manager (500) is configurable to operate at any bus voltage that practically allows power devices to connect to the power bus with or without a power conversion.

To select a power bus operating voltage, the electronic controller (550) polls each device port to gather power characteristics of all of the connected power devices and makes a determination as to which devices connected to the device ports require a power conversion to connect to the power bus based on the present power bus operating voltage. If no conversions are required, the power devices are connected to the power bus without power conversion over non-converted power channels (5080, 5085, 5090, and 5095). If power conversions are required and the present power bus operating voltage is suitable for the present power manager configuration, the electronic controller (550) configures the appropriate power converter(s) to make the required power conversion and then connects the power external power devices that need a power conversion to the to the power bus over a power converter (510, 515, 520, 525).

In a further evaluation step the electronic controller processes one or more bus voltage evaluations to determine if there is a more suitable bus voltage for the present power manager configuration and if so, the electronic controller (550) resets the power bus operating voltage to a new operating voltage selected from the list of voltage operating points and reconfigures power converters and reconnects the external power devices to the power bus over the same or different connection paths. The electronic controller (550) periodically polls each device port to refresh system information including the power characteristics of external power devices connected to device ports and repeats the power bus operating voltage evaluation described above as the configuration of the power manager changes due to added or removed power device connections and/or changes in power characteristics of connected devices.

6 EXAMPLES 6.1 Example 1: Operating Mode

The electronic controller (550) has previously set the power bus operating voltage to a desired power bus voltage or to a default bus voltage such as at initial power up. The electronic controller stores a plurality of power bus operating voltage values that it can operate with and also stores power manager performance criteria in a memory associated with the power manager. The electronic controller polls each device port and determines the power characteristics of all of the connected power devices (530, 540) and compares the power characteristics (e.g. operating voltage range) of all of the connected power devices with the present power bus operating voltage value. The electronic controller then uses one or more rules or algorithms stored in the memory module to determine if the present power bus operating voltage value should be maintained or changed to meet one or more of the desired operating criteria. If the present power bus operating voltage value is acceptable and the device configuration has not changed from the last time the electronic controller polled the device ports, no changes in operating parameters of the power manager are carried out.

If the present power bus operating voltage value is acceptable and the device configuration has changed from the last time the electronic controller polled the device ports, the electronic controller makes the appropriate operating parameter adjustments such as to connect a power device to the bus with or without a conversion by actuating appropriate switches (not shown) and setting power converter operating points as required to connect power devices to the power bus. However, if the electronic controller determines that a change to the power bus operating voltage will better meet one or more power manager operating criteria defined in the energy management schema, it resets the power bus operating voltage value to one of the voltage values stored in memory and, if needed, makes the appropriate changes to power manager device settings and connections. Such changes include readjusting power converter settings to accommodate the new power bus voltage value, connecting power devices that require power conversion to the bus through one or more power converters, and connecting power devices with power requirements that match the new power bus voltage directly to the power bus without a power conversion.

6.2 Example 2 Algorithm for Minimizing Power Conversion Losses

In one particularly beneficial embodiment, the electronic controller (550) uses the below listed algorithm to minimize power loss due to power conversions when a single power source is connected to the power manager. This algorithm uses the fundamental relationship that power lost in a converter is proportional to the difference between the power converter input and output voltages multiplied by a loss factor. The loss factor is generally power converter dependent and may vary from one power converter type or model to another. Additionally loss factor may depend on input to output current amplitude ratio which can be determined from the input and output voltage and the total power being converted. Accordingly for a given system, loss factor values may comprise a preset value depending on power converter type plus a current ratio estimate based on voltage ratio and total power being converted. Otherwise loss factors for various conditions can be stored in a look up table or estimated in various other ways. Alternately the algorithm can be simplified to only consider the voltage difference across the power converters.

An illustrative, non-limiting example of use of the algorithm follows. In this example, the system includes one input and one output power converter. The algorithm can be expanded to use any number of input and output power converters.

1) Detect the operating voltage and current of the power source and each of the power loads.
2) Does the power source operating voltage range allow connection with the power bus at the present power bus operating voltage?
   a) Yes—Connect the power source to the power bus without conversion, go to step 3.
   b) No—Calculate a power bus voltage value that minimizes total power loss through all converters in the system.
i. Let Ls=input conversion loss per Volt difference converted for a given input voltage and current in the input converter.
ii. Let Lo=output conversion loss per Volt difference converted for a given output voltage and current on the output converter.
iii. Let Iin=The Input current to an input power converter.

iv. Let Tout=the output current from an output power converter.
v. Let Vin=the voltage at an input power converter.
vi. Let Vout=the voltage at an output power converter.
vii. Select Ls and Lo from a stored table of values based on Vin, Vout, Iin, and Tout requirements.
viii. Select Vbus by minimizing:

$$Ls*|Vin-Vbus|+Lo*|Vout-Vbus| \quad \text{Equation 2}$$

ix. Select a Vbus value stored in memory that most closely matches the Vbus value calculated in Equation 2.
x. Set the input power converter to connect the input source to the power bus with the power bus voltage value equal to the selected Vbus value, go to step 3.
3) Set output power converter(s) to power any output device(s) from the power bus at the present power bus voltage value.

Further illustrative, non-limiting, examples include the of use of the algorithm for minimizing power conversion losses expanded to one or more input power conversions and/or one or more output power conversion. When a single input power conversion and multiple output power conversions are required, selecting Vbus includes minimizing the equation:

$$(Ls*|Vin-Vbus|) + \sum_{y=1}^{n}(Lo_y*|Vout_y-Vbus_y|) \quad \text{Equation 3}$$

Where: n=number of output power conversions; and where Lo may not be the same for each output power converter Where multiple input power conversions and multiple output power conversions are required, selecting Vbus includes minimizing the equation:

$$\sum_{x=1}^{m}(Ls_x*|Vin_x-Vbus_x|) + \sum_{y=1}^{n}(Lo_y*|Vout_y-Vbus_y|) \quad \text{Equation 4}$$

Where: m=number of input power conversions; and n=number of output power conversions; where Ls may not be the same for each input power converter; and where Lo may not be the same for each output power converter.

6.3 Example 3: Practical Example for Minimizing Conversion Power Loss

As can be seen from examining Equations 1 and 2, the power loss is minimized by minimizing the difference between the input and output power conversion. As an example, referring to FIG. 5, the power manager (500) has a default bus voltage value of 15 volts. A 30 volt power source (530a) is connected to one of the input ports (503a) and 30 volt power loads (540a and 540b) are connected to each of the two output ports (504a and 504b). The output loss, Lo, is the same for each output power conversion. The algorithm described above determines that the input loss is 15Ls based on the difference Vin-Vbus and that the output loss Lo is 30Lo based on 2×Vout-Vbus (i.e. one loss for each output device). Thus, the simple answer is to make Vbus equal to 30 volts, which allows all three devices to be connected to the power bus without a power conversion. However, the algorithm then checks the lookup table for 30 volts but finds that 28 volts is the closest match and the bus voltage is set to 28 Volts. In the next step, the input power converter (515) is set to convert the 30 volt input source (530a) to 28 volts for connection to the power bus (505). In step 3, each of the output converters (520) and (525) are set to convert the 28 volt power bus voltage to 30 volts to power the 30 volt power loads (540a and 540b). In this case where the bus voltage is set to 28 volts the power loss is 2Ls on the input side and 4Lo on the output side. This the power loss is decreased from 15 Ls+30Lo to 2Ls+4Lo.

It will also be recognized by those skilled in the art that, while the invention has been described above in terms of preferred embodiments, it is not limited thereto. Whereas exemplary embodiments include specific characteristics such as, for example, numbers of device ports, certain bus voltages and voltage ranges, power converter ranges, DC-to-DC power conversion, those skilled in the art will recognize that its usefulness is not limited thereto. Various features and aspects of the above described invention may be used individually or jointly. Further, although the invention has been described in the context of its implementation in a particular environment, and for particular applications (e.g. implemented within a power manager), those skilled in the art will recognize that its usefulness is not limited thereto and that the present invention can be beneficially utilized in any number of environments and implementations where it is desirable to selectively connect power devices to a common power bus and to manage power distributing and minimize power losses due to power conversions or other factors related to power parameters of power devices. Accordingly, the claims set forth below should be construed in view of the full breadth and spirit of the invention as disclosed herein.

What is claimed is:
1. A power manager comprising:
a DC power bus;
a plurality device ports each configured to interface with an external power device comprising any one of a DC power source, a DC power load and a rechargeable DC battery;
a unidirectional DC to DC input power converter having an input side and an output side;
an input power channel disposed between the DC power bus and a first of a plurality of device ports wherein the input power channel includes a first input portion that connects the input power converter input side to the first of the plurality of device ports and a first input switch disposed along the first input portion, and a second input portion that connects the input power converter output side to the DC power bus, wherein operation of the first input switch selectively connects the input power converter input side to, or selectively disconnects the input power converter input side from, the first of the plurality of device ports;
a unidirectional DC to DC output power converter having an input side and an output side;
an output power channel disposed between the DC power bus and a second of the plurality of device ports wherein the output power channel includes a first output portion that connects the output power converter output side to the second of the plurality of device ports and first output switch disposed along the first output portion and a second portion that connects the output power converter input side to the DC power bus wherein operation of the first output switch selectively connects the output power converter output side to, or selectively disconnects the output power converter output side from the second of the plurality of device ports;

a first universal power channel that includes a first controllable switch disposed between the output side of the output power converter and the first of the plurality of device ports;

wherein the power manager operates at least one of the input power converter, the first input switch, the output power converter the first output switch and the first controllable switch to selectively connect a first external power device connected to the first of the plurality of device ports to the input side of the input power converter for connection to the DC power bus as a power source, with an input power conversion, or to selectively connect the first external power device connected to the first of the plurality of device ports to the output side of the output power converter for connection to the DC power bus as a power load, with an output power conversion.

2. The power manager of claim 1:

wherein the operation of the first output switch by the power manager selectively disconnects the the second of the plurality of device ports from the output side of the output power converter or selectively connects a second external power device connected to the second of the plurality of device ports to the output side of the output power converter for connection to the DC power bus as a power load, with the output power conversion.

3. The power manager of claim 2 further comprising:

an electronic controller comprising a digital data processor and a digital data memory module, and an energy management schema program operated by the electronic controller;

wherein the electrical electronic controller operates one or more controllable switches and unidirectional DC to DC power converters corresponding with the power manager.

4. The power manager of claim 3 further comprising:

a communication interface corresponding with the electronic controller; and a plurality communication channels extending from the communication interface to each of the plurality of device ports, wherein the communication interface, the plurality of communication channels and the plurality of the plurality of device ports are operable to communicate digital data received from each external power device connected to one of the plurality of device ports to the electronic controller.

5. The power manager of claim 4 wherein the energy management schema is configured to monitor each external power device connected to any one of the plurality of device ports and to determine if or how each external power device can be connected to the DC power bus.

6. The power manager of claim 1:

further comprising a third of the plurality of device ports connected to the input side of the input power converter and a second input switch disposed between the third of the plurality of device ports and the input side of the input power converter;

wherein the power manager further operates the second input switch to selectively connect a third external power device connected to the third of the plurality of device ports to the DC power bus as a power source, with an input power conversion, while the first external power device connected to the first of the plurality of device ports is connected to the DC power bus over the universal power channel as a power load, with output power conversion.

7. The power manager of claim 6:

further comprising a fourth of the plurality of device ports connected to output side of the output power converter and a second output switch disposed between the fourth of the plurality of device ports and the output side of the output power converter;

wherein the power manager further operates the second output switch to selectively connect a fourth external power device connected to the fourth of the plurality of device ports to the DC power bus as a power load, with an output power conversion.

8. The power manager of claim 7 further comprising:

a second universal power channel that includes a second first controllable switch disposed between the output side of the output power converter and the third of the plurality of device ports;

wherein the power manager operates at least one of the input power converter, the second input switch, the second output switch and the output power converter to connect a second external power device connected to the second of the plurality of device ports to the output side of the output power converter as a power load with an output power conversion.

9. The power manager of claim 5 wherein the energy management schema is operable to poll each of the plurality of device ports to determine power characteristics of each external power device connected to anyone of the plurality of device ports.

10. The power manager of claim 3 further comprising a bus sensor module in communication with the DC power bus and with the electronic controller for reporting a power bus operating voltage to the electronic controller.

11. A power manager comprising:

a DC power bus;

a unidirectional DC to DC input power converter having an input side and an output side, the output side of the unidirectional input power converter being connected to the power bus;

a first device port connected to the input power converter input side;

a unidirectional DC to DC output power converter having an input side and an output side, the input side of the unidirectional output power converter being connected to the power bus;

a second device port connected to the output side of the unidirectional output power converter; and a universal power channel that includes an operable switch disposed between the output side of the output power converter and the first device port, wherein the power manager operates the input power converter, the output power converter and the operable switch to selectively connect a first external power device connected to the first device port to the input side of the input power converter for connection to the power bus with an input power conversion or to selectively connect the first external power device to the output side of the output power converter for connection to the power bus with an output power conversion.

12. A power manager as recited in claim 11, further comprising:

a third device port connected to the unidirectional input power converter input side;

a fourth device port connected to the output side of the unidirectional output power converter; and a second universal power channel including a second operable switch disposed between the output side of the unidirectional output power converter and the third device port.

13. The power manager of claim 1 wherein the input power conversion includes a voltage change.

14. The power manager of claim 2 wherein the output power conversion includes a voltage change.

* * * * *